United States Patent
Wu et al.

(10) Patent No.: US 8,916,051 B2
(45) Date of Patent: Dec. 23, 2014

(54) METHOD OF FORMING VIA HOLE

(75) Inventors: Cheng-Han Wu, Taichung (TW); Chun-Chi Yu, Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 405 days.

(21) Appl. No.: 12/977,092

(22) Filed: Dec. 23, 2010

(65) Prior Publication Data

US 2012/0164835 A1    Jun. 28, 2012

(51) Int. Cl.
| | |
|---|---|
| *H01L 21/311* | (2006.01) |
| *H01L 21/302* | (2006.01) |
| *H01L 21/033* | (2006.01) |
| *H01L 21/768* | (2006.01) |
| *H01L 21/3213* | (2006.01) |

(52) U.S. Cl.
CPC ...... *H01L 21/31144* (2013.01); *H01L 21/0337* (2013.01); *H01L 21/76816* (2013.01); *H01L 21/32139* (2013.01)
USPC .............. 216/41; 438/702; 438/717; 438/736

(58) Field of Classification Search
None
See application file for complete search history.

(56) References Cited

U.S. PATENT DOCUMENTS

| | | | | |
|---|---|---|---|---|
| 6,420,097 | B1* | 7/2002 | Pike et al. | 430/313 |
| 2005/0153540 | A1* | 7/2005 | Mimotogi et al. | 438/637 |
| 2006/0257795 | A1 | 11/2006 | Lin | |
| 2007/0093070 | A1* | 4/2007 | Ghandehari et al. | 438/717 |
| 2008/0054454 | A1* | 3/2008 | Kagawa et al. | 257/734 |
| 2008/0160770 | A1* | 7/2008 | Bok | 438/703 |
| 2009/0162790 | A1* | 6/2009 | Romano et al. | 430/311 |
| 2009/0179004 | A1* | 7/2009 | Kajiwara | 216/47 |
| 2009/0258501 | A1* | 10/2009 | Chan | 438/703 |
| 2010/0009542 | A1* | 1/2010 | Honda et al. | 438/702 |

OTHER PUBLICATIONS

Martin Drapeau, "Double patterning design split implementation and validation for the 32nm node", Proc. of SPIE vol. 6521 652109, Mar. 21, 2007.

\* cited by examiner

*Primary Examiner* — Shamim Ahmed
*Assistant Examiner* — Bradford Gates
(74) *Attorney, Agent, or Firm* — Winston Hsu; Scott Margo

(57) ABSTRACT

The present invention provides a method of forming via holes. First, a substrate is provided. A plurality of first areas is defined on the substrate. A dielectric layer and a blocking layer are formed on the substrate. A patterned photoresist layer is formed on the blocking layer. The patterned photoresist layer includes a plurality of holes arranged in a regular array wherein the area of the hole array is greater than those of the first areas. The blocking layer in the first areas is removed by using the patterned photoresist layer as a mask. Lastly, the dielectric layer is patterned to form at least a via hole in the dielectric layer in the first area.

20 Claims, 6 Drawing Sheets

METHOD OF FORMING VIA HOLE

BACKGROUND OF THE INVENTION

1. Field of the Invention

The present invention relates to a method of forming a via hole, and more particularly, to a method of forming a via hole by using a blocking layer.

2. Description of the Prior Art

Lithography processing, which is an essential technology when manufacturing integrated circuits, is used for defining geometries, features, lines, or shapes onto a die or wafer. In the integrated circuit making processes, lithography plays an important role in limiting feature size. By using lithography, a circuit pattern can be precisely and accurately transferred onto a die or wafer. However, with the increasing complexity and integration of the integrated circuits, conventional lithography process has met a lot of difficulties.

For example, in the process of manufacturing via holes, the pore size of the via hole and the distance between each via hole will be limited by the resolution of the photo mask. In prior art methods for producing via holes, the photo resist layer serves as an etching mask for etching the underlying dielectric layer. For the 22 nm process, the pitch (the distance of centers of two neighboring via holes) for via holes must be lower than 90 nm and the "after development inspect critical dimension" (ADICD) must be around 35-50 nm. For the current lithographic tools, it is impossible to create contact holes with pitch lower than 90 nm in one exposure. The current solution is that the desired via holes are patterned by two exposures with two photo masks on a photo resist layer, and then followed by one etching step. Thus, a via hole array with less pitch can be obtained.

By the aforementioned two exposing processes, a regular arrangement of the via hole array can be obtained. However, the method is suitable for forming the memory array, but may not be suitable for forming an integrated circuit layout which has irregular via hole arrangement.

SUMMARY OF THE INVENTION

The present invention therefore provides a method of forming a via hole, which is suitable for forming an integrated circuit layout and is able to produce via holes with smaller pore size.

First, a substrate is provided. A plurality of first areas is defined on the substrate. A dielectric layer and a Mocking layer are formed on the substrate. A patterned photoresist layer is formed on the Mocking layer. The patterned photoresist layer includes a hole array wherein the area of the hole array is greater than those of the first areas. The Mocking layer in the first areas is removed by using the patterned photoresist layer as a mask. Lastly, the dielectric layer is patterned to form at least a via hole in the dielectric layer in the first areas.

As a patterned blocking layer is employed in the present invention before the etching step for forming via holes, the via holes can be formed only in the desired region (that is, the first region) rather than other regions. Accordingly, the method provided in the present invention can produce via holes with smaller pore size by using the dual exposing processes, and on the other hand, the method in the present invention can be used in forming an integrated circuit layout with irregular via hole arrangement.

These and other objectives of the present invention will no doubt become obvious to those of ordinary skill in the art after reading the following detailed description of the preferred embodiment that is illustrated in the various Figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
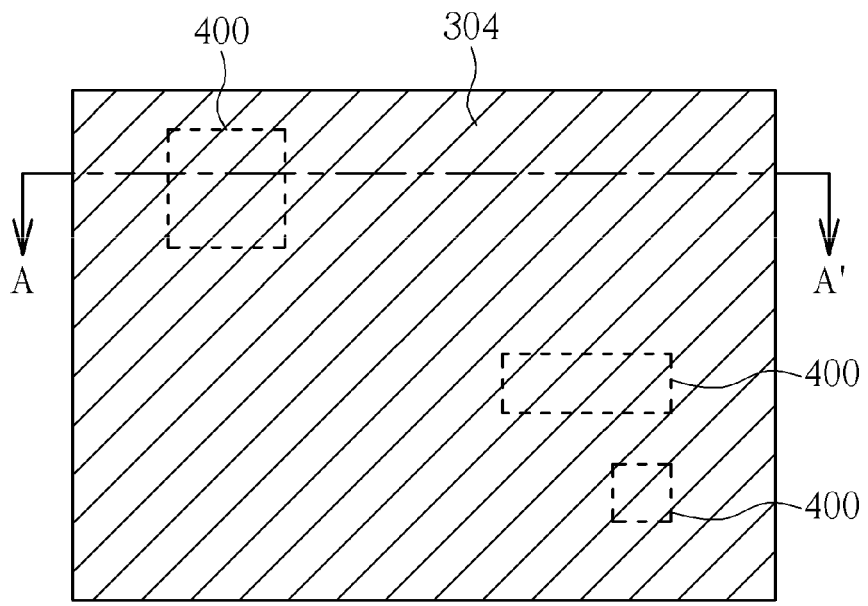
FIG. 1 to FIG. 12 illustrate schematic diagrams of the method of forming via hole in the preset invention.
Figure 2:
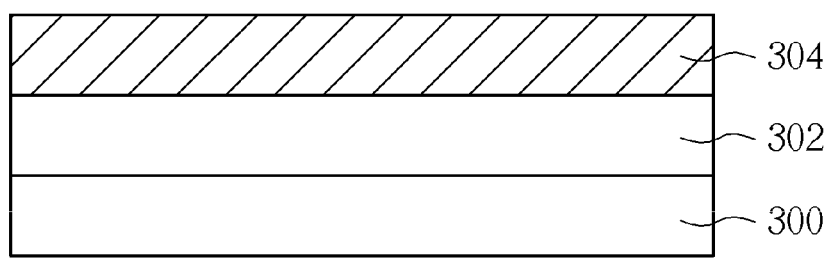

Please refer to FIG. 1 to FIG. 12, illustrating schematic diagrams of the method of forming via hole in the preset invention. Please refer to FIG. 1 and FIG. 2, wherein FIG. 2 is a cross-sectional view according to FIG. 1 along line AA'. As shown in FIG. 1 and FIG. 2, a substrate 300 is first provided. The substrate 300 may be a silicon substrate. In another embodiment, the substrate 300 may include a silicon substrate with a plurality of dielectric layers or protective layers disposed thereabove (not shown). As shown in FIG. 1, at least a first region 400 is defined on the substrate 300. The first region 400 indicates the areas where the via holes will be formed within in the subsequent steps.

Subsequently, a dielectric layer 302 is formed on the substrate 300. The forming method may include a plasma enhanced chemical vapor deposition (PECVD), a high density plasma CVD or a spin coating process, but should not be limited thereto. The dielectric layer 302 may include a single-layer structure or a multi-layer structure made of dielectric materials, such as silicon dioxide ($SiO_2$), silicon nitride (SiN), silicon carbide (SiC), silicon oxynitride (SiON), undoped silicate glass (USG)、 borophosphosilicate glass (BPSG)、 FSG (fluorine-doped silicate glass), HSQ (hydrogen silsesquioxane) (SiO: H), MSQ (methyl silsesquioxane) (SiO: $CH_3$), HOSP, H-PSSQ (hydrio polysilsesquioxane), M-PSSQ (methyl polysilsesquioxane), P-PSSQ (phenyl polysilsesquioxane), porous sol-gel or their combination, but should not be limited thereto.

Next, a blocking layer 304 is formed on the dielectric layer 302. The forming method may include a PECVD, a high-density plasma CVD or a spin coating process. The blocking layer 304 may include an organic layer such as a Si-content bottom anti-reflective coating (Si-content BARC) layer.

Figure 3:
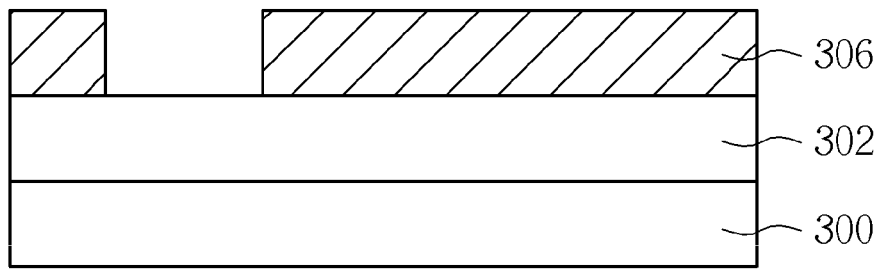

As shown in FIG. 3, the blocking layer 304 is patterned to remove the portion of the blocking layer 304 in the first region 400, thereby forming a patterned blocking layer 306. For example, a photoresist layer (not shown) is formed on the blocking layer 304, followed by a lithography process to remove the photoresist layer in the first region 400. An etching step is carried out by using the patterned photoresist layer as a mask to remove the blocking layer 304 within the first region of 400. The photoresist layer is then removed. By using appropriate etchant or etching recipe, the etching rate of the Mocking layer 304 is greater than that of the dielectric layer 302. Accordingly, the patterning process toward the Mocking layer 304 can be performed without etching away the dielectric layer 302.

Figure 4:
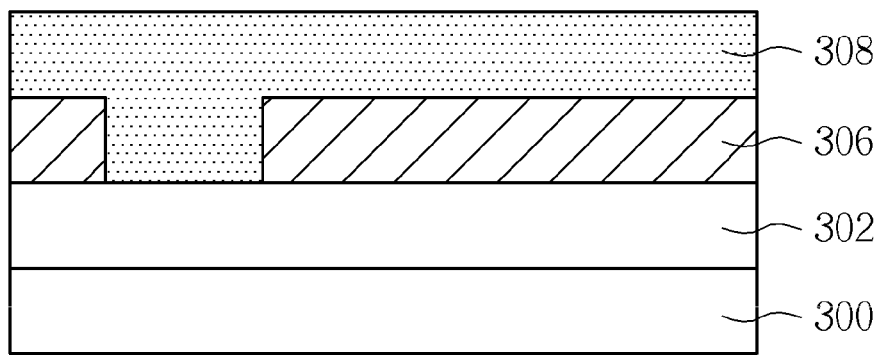
Figure 5:
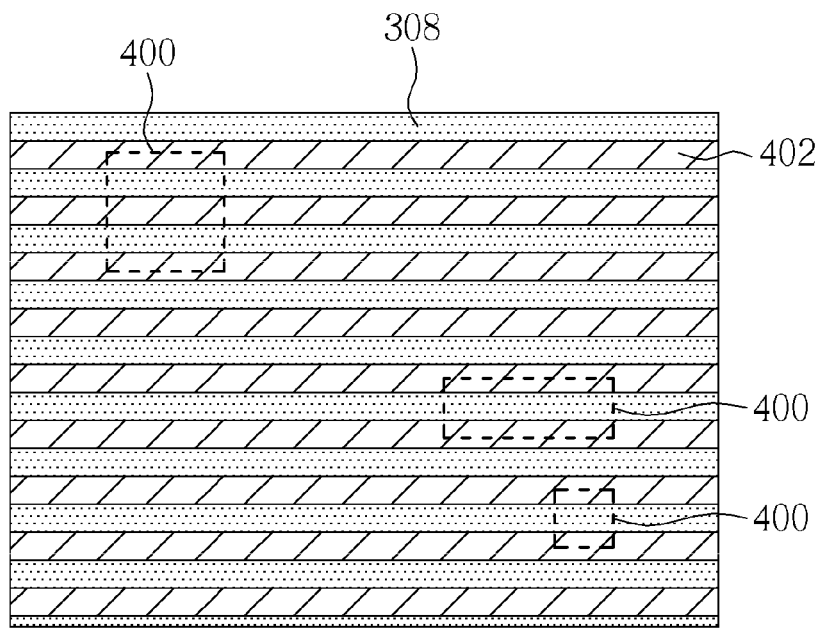

As shown in FIG. 4, a first photoresist layer 308 is formed on the patterned blocking layer 306. In one embodiment of the present invention, the first photoresist layer 308 includes positive photoresist material. Then, a first exposing process is performed by using a first mask (not shown) to expose the first photoresist layer 308. The first mask may include a plurality of first stripe patterns 402. Please refer to FIG. 5 which shows the relative position of the first stripe patterns and the below first photoresist layer 308 when using the first mask to perform the first exposing process. As shown in FIG. 5, each first stripe pattern 402 is parallel to each other. It is understood that the first photoresist layer 308 in the region covered by the first stripe pattern will not be subjected to the first exposing process. Then, a first development process is performed to remove the first photoresist layer 308 not covered by the first stripe pattern 402.

Figure 6:
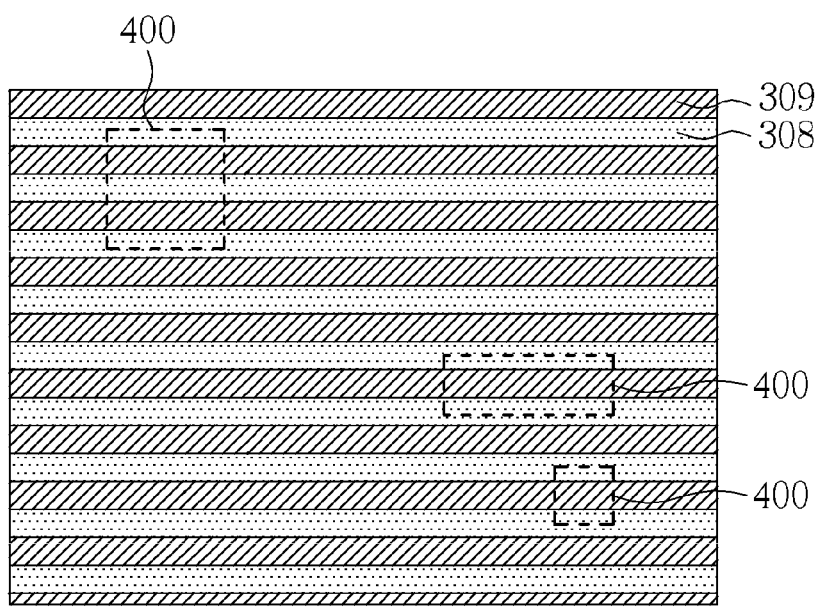

Then, as shown in FIG. 6, a second photoresist layer 309 is formed on the patterned first photoresist layer 308. Then, a planarization process is carried out such that the first photoresist layer 308 and the second photoresist layer 309 form a zebra-crossing arrangement as shown in FIG. 6. It is noted that the second photoresist layer 309 includes positive photoresist material, and the second photoresist layer 309 and the first photoresist layer 308 are not dissolvable to each other.

Figure 7:
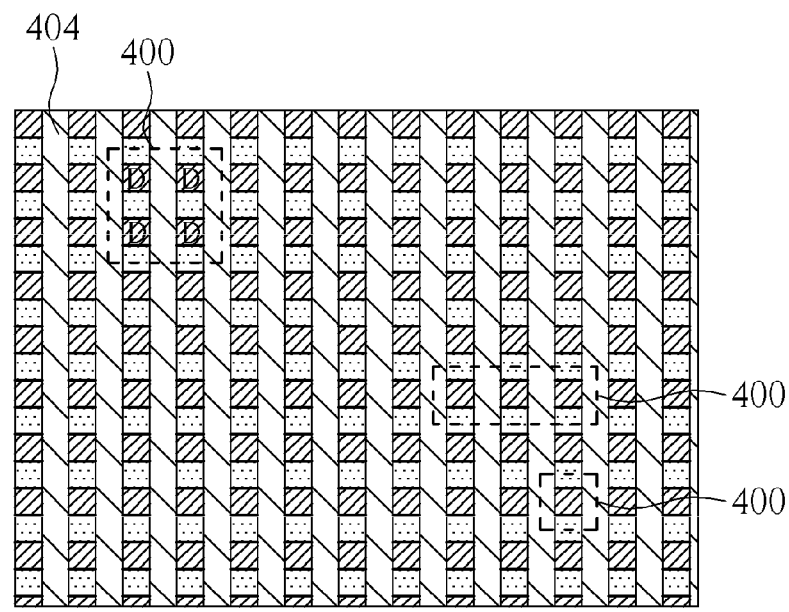

As shown in FIG. 7, a second exposing process is performed by using a second mask (not shown) to expose the second photoresist layer 309. The second mask includes a plurality of second stripe patterns 404 which are parallel to each other. In one embodiment of the present invention, the first stripe patterns 402 interlace with the second stripe pattern 404 in a 45-degree or 60-degree intersection. In one preferred embodiment, the first stripe patterns 402 are substantially perpendicular to the second stripe patterns 404. The areas not covered by the first stripe pattern 402 and the second stripe pattern 404 are called areas D. Because the light source in the second exposing process only functions on the second photoresist layer 309 instead of the first photoresist layer 308, only the second photoresist layer 309 in areas D is exposed during the second exposing process.

Figure 8:
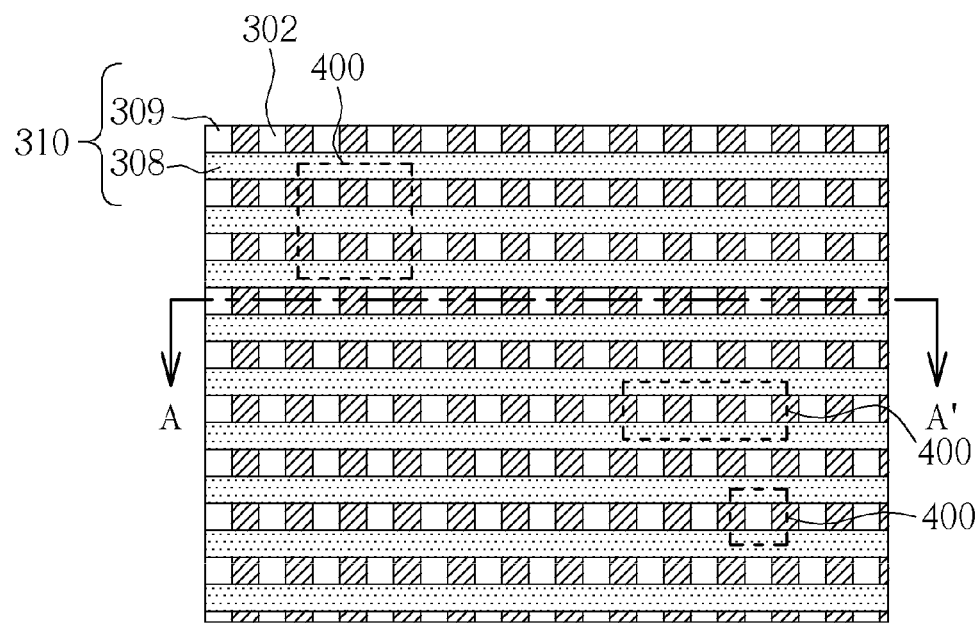
Figure 9:
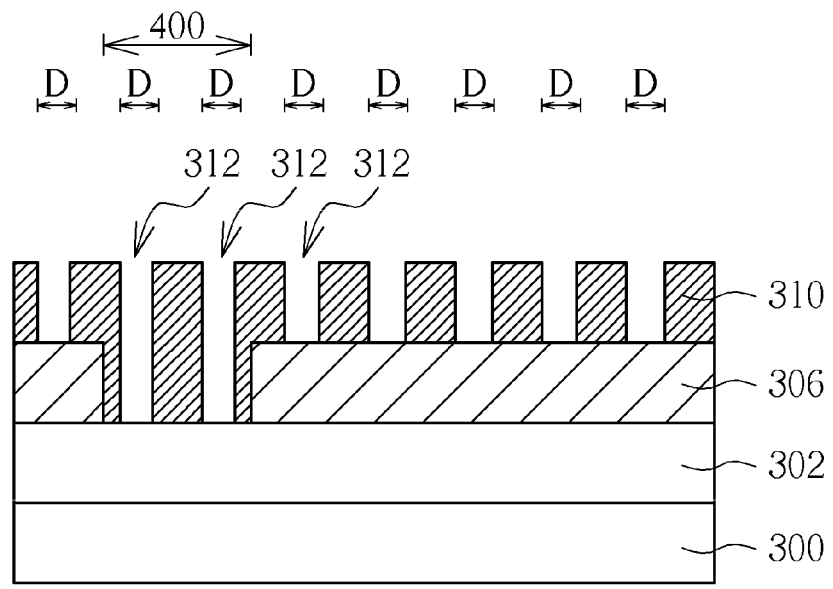

Please refer to FIG. 8 and FIG. 9, wherein FIG. 9 is a cross-sectional view according to FIG. 8 along line AA'. As shown in FIG. 8 and FIG. 9, a second development process is performed to remove the second photoresist layer 309 in areas D, thereby forming a patterned photoresist layer 310. It is understood that the patterned photoresist layer 310 is consisted of the first photoresist layer 308 and the second photoresist layer 309. The patterned photoresist layer 310 includes a plurality of holes arranged in a regular array (hole array). It is noted that, only the holes 312 in the first region 400 would expose the under-lied dielectric layer 302. The holes 312 in the regions other than the first region 400 would be blocked by the patterned blocking layer 306 and cannot expose the dielectric layer 302.

Besides the aforementioned method which uses the first photoresist layer 308 and the second photoresist layer 309 in conjugation of two exposing processes and two development processes, in another embodiment, the patterned photoresist layer 310 can also be formed by using one photoresist layer in conjugation of two exposing processes and one development process, or, by directly using a mask having the first stripe patterns 402 plus the second stripe patterns 404. It is understood that the patterned photoresist layer 310 can be formed by other methods. Any methods that can form the patterned photoresist layer 310 with holes in a regular array may be built falls within the spirit and the scope of the present invention.

Figure 10:
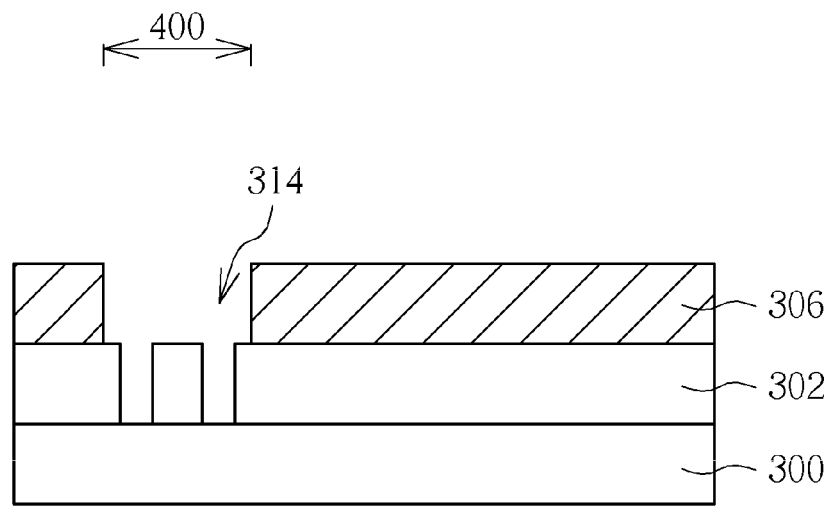
Figure 11:
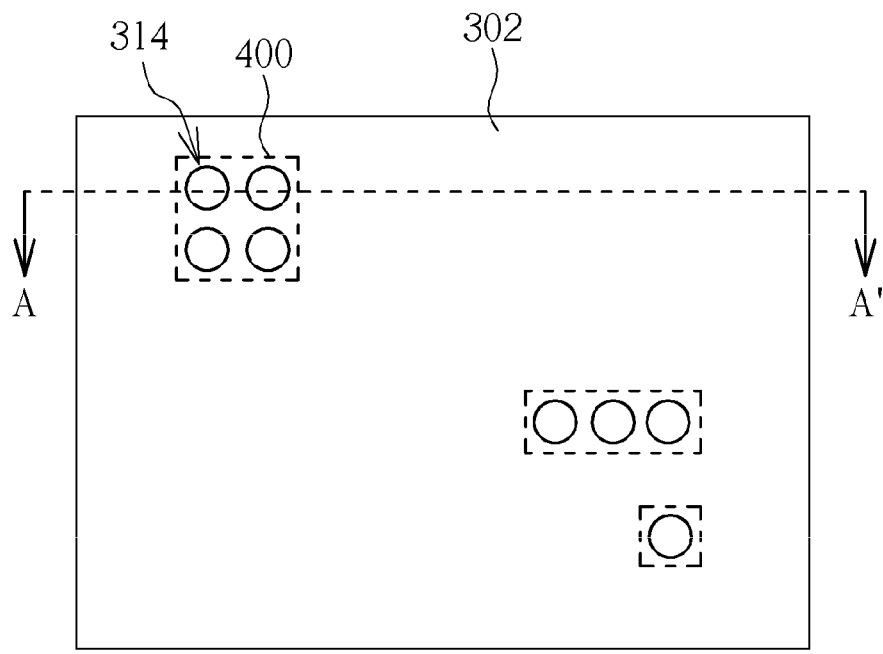
Figure 12:
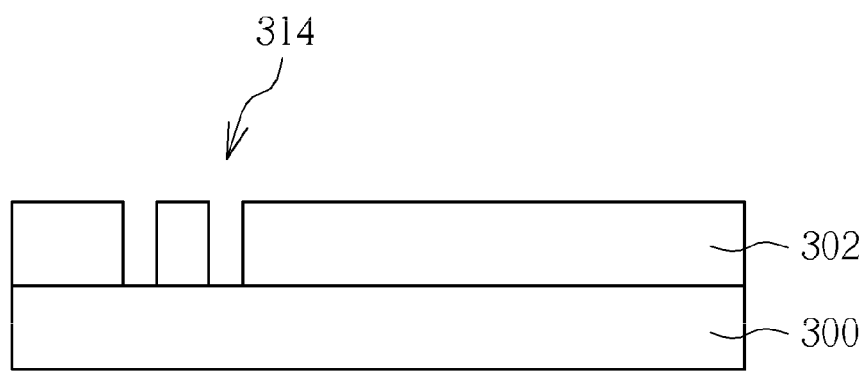

As shown in FIG. 10, an etching process is performed by using the patterned photoresist layer 310 as a mask to form a plurality of via holes 314 in the dielectric layer 302 only within the first region 400. Next, please refer to FIGS. 11 and 12 wherein FIG. 12 is a cross-sectional view according to FIG. 11 along line AA'. The blocking layer 306 is then removed, and a dielectric layer 302 with a plurality of via holes 314 only in the first regions 400 can be obtained.

In light of above, as a patterned blocking layer is employed in the present invention before the etching step for forming via holes, the via holes can be formed only in the desired region (that is, the first region) rather than other regions. Accordingly, the method provided in the present invention can produce via holes with smaller pore size by using the dual exposing processes and on the other hand, the method in the present invention can be used in forming an integrated circuit layout with irregular via hole arrangement.

Those skilled in the art will readily observe that numerous modifications and alterations of the device and method may be made while retaining the teachings of the invention.

What is claimed is:

1. A method of forming via hole, comprising:
providing a substrate, wherein at least a first region is defined on the substrate;
forming a dielectric layer and a blocking layer on the substrate, wherein the blocking layer is disposed on the dielectric layer;
removing a portion of the blocking layer in the first region;
forming a patterned photoresist layer on the blocking layer such that a sidewall of the blocking layer is completely covered by the patterned photoresist layer, wherein the patterned photoresist comprises a plurality of holes arranged in a regular array wherein the area of the hole array is greater than that of the first region, and the dielectric layer is exposed by the holes; and
patterning the dielectric layer by using the patterned photoresist layer as a mask to form at least a via hole in the dielectric layer in the first region.

2. The method of forming via hole according to claim 1, wherein the blocking layer comprises an organic layer.

3. The method of forming via hole according to claim 2, wherein the organic layer comprises a Si-content BARC layer.

4. The method of forming via hole according to claim 1, wherein the step of forming the patterned photoresist layer comprises:
forming a first photoresist layer on the blocking layer;
performing a first exposing process and a first development process toward the first photoresist layer to form a patterned first photoresist layer;
forming a second photoresist layer on the patterned first photoresist layer; and
performing a second exposing process and a second development process toward the second photoresist layer to form a patterned second photoresist layer, wherein the patterned first photoresist layer and the patterned second photoresist layer form the patterned photoresist layer.

5. The method of forming via hole according to claim 4, wherein the material of the first photoresist layer is different from that of the second photoresist layer.

6. The method of forming via hole according to claim 4, wherein the second exposing process functions only toward the second photoresist layer.

7. The method of forming via hole according to claim 4, wherein the first exposing process comprises using a first mask comprising a plurality of first stripe patterns and the second exposing process comprises using a second mask comprising a plurality of second stripe patterns.

8. The method of forming via hole according to claim 7, wherein the first stripe patterns are substantially perpendicular to the second stripe patterns.

9. The method of forming via hole according to claim 1, wherein after patterning the dielectric layer, the method further comprising removing the blocking layer.

10. The method of forming via hole according to claim 1, wherein the via hole is formed in the dielectric layer only in the first region.

11. A method of forming via hole, comprising:
- providing a substrate, wherein at least a first region is defined on the substrate;
- forming a dielectric layer and a blocking layer on the substrate;
- removing a portion of the blocking layer in the first region;
- after removing the portion of the blocking layer in the first region, forming a patterned photoresist layer on the blocking layer such that a sidewall of the blocking layer is completely covered by the patterned photoresist layer, wherein the patterned photoresist comprises a plurality of holes arranged in a regular array wherein the area of the hole array is greater than that of the first region, and the dielectric layer is exposed by the holes; and
- patterning the dielectric layer by using the patterned photoresist layer as a mask to form at least a via hole in the dielectric layer in the first region.

12. The method of forming via hole according to claim 11, wherein the blocking layer comprises an organic layer.

13. The method of forming via hole according to claim 12, wherein the organic layer comprises a Si-content BARC layer.

14. The method of forming via hole according to claim 11, wherein the step of forming the patterned photoresist layer comprises:
- forming a first photoresist layer on the blocking layer;
- performing a first exposing process and a first development process toward the first photoresist layer to form a patterned first photoresist layer;
- forming a second photoresist layer on the patterned first photoresist layer; and
- performing a second exposing process and a second development process toward the second photoresist layer to form a patterned second photoresist layer, wherein the patterned first photoresist layer and the patterned second photoresist layer form the patterned photoresist layer.

15. The method of forming via hole according to claim 14, wherein the material of the first photoresist layer is different from that of the second photoresist layer.

16. The method of forming via hole according to claim 14, wherein the second exposing process functions only toward the second photoresist layer.

17. The method of forming via hole according to claim 14, wherein the first exposing process comprises using a first mask comprising a plurality of first stripe patterns and the second exposing process comprises using a second mask comprising a plurality of second stripe patterns.

18. The method of forming via hole according to claim 17, wherein the first stripe patterns are substantially perpendicular to the second stripe patterns.

19. The method of forming via hole according to claim 11, wherein after patterning the dielectric layer, the method further comprising removing the blocking layer.

20. The method of forming via hole according to claim 11, wherein the via hole is formed in the dielectric layer only in the first region.

* * * * *